(12) United States Patent
Sagarwala et al.

(10) Patent No.: US 6,759,717 B2
(45) Date of Patent: Jul. 6, 2004

(54) CMOS INTEGRATED CIRCUIT DEVICE WITH LDD N-CHANNEL TRANSISTOR AND NON-LDD P-CHANNEL TRANSISTOR

(75) Inventors: Pervez Hassan Sagarwala, Irving, TX (US); Mehdi Zamanian, Carrollton, TX (US); Ravi Sundaresan, Plano, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/800,039

(22) Filed: Mar. 6, 2001

(65) Prior Publication Data

US 2001/0009796 A1 Jul. 26, 2001

Related U.S. Application Data

(62) Division of application No. 08/885,636, filed on Jun. 30, 1997, now Pat. No. 6,221,709.

(51) Int. Cl.[7] ............................................. H01L 29/76
(52) U.S. Cl. ..................... 257/369; 257/344; 257/408; 257/900
(58) Field of Search ................................ 257/369, 408, 257/344, 900

(56) References Cited

U.S. PATENT DOCUMENTS

| | | | |
|---|---|---|---|
| 4,530,150 A | * | 7/1985 | Shirato ........................ 29/576 |
| 4,891,326 A | | 1/1990 | Koyanagi ..................... 437/29 |
| 5,087,582 A | | 2/1992 | Campbell et al. ............. 437/41 |
| 5,098,855 A | | 3/1992 | Komori et al. ................ 437/52 |
| 5,266,823 A | | 11/1993 | Noji et al. .................... 257/327 |
| 5,273,914 A | | 12/1993 | Miyajima et al. ............. 437/34 |
| 5,291,052 A | | 3/1994 | Kim et al. .................... 257/369 |
| 5,324,974 A | | 6/1994 | Liao ............................ 257/344 |
| 5,668,024 A | | 9/1997 | Tsai et al. .................... 438/199 |
| 5,766,991 A | | 6/1998 | Chen ........................... 438/231 |
| 6,221,709 B1 | * | 4/2001 | Sagarwala et al. .......... 438/231 |

* cited by examiner

*Primary Examiner*—Mark V. Prenty
(74) *Attorney, Agent, or Firm*—Lisa K. Jorgenson; William A. Munck

(57) ABSTRACT

A method of fabricating an integrated circuit having an n-channel and a p-channel transistor is provided. The method includes forming LDD regions for the n-channel transistors self-aligned to the gate electrodes. A first oxide is then formed over the structure and the n-type silicon regions are implanting with a p+ type dopant through the first oxide to form the source and drain regions of the p-channel transistor. A second oxide is formed over structure. The two oxide layers are then etched to provide sidewall spacers, having an inner portion formed from the first oxide and an outer portion formed from the second oxide. The p-type silicon regions are implanted with an n+ type dopant to form the low resistivity regions of the n-channel transistor. The p+ implants in the source and drain of the p-channel transistor typically outdiffuse toward the gates during further thermal processing of the device. The resulting integrated circuit has an LDD n-channel transistor and a p-channel transistor without an LDD region.

16 Claims, 4 Drawing Sheets

CMOS INTEGRATED CIRCUIT DEVICE WITH LDD N-CHANNEL TRANSISTOR AND NON-LDD P-CHANNEL TRANSISTOR

This application is a division of prior U.S. application Ser. No. 08/885,636 filed on Jun. 30, 1997 and now U.S. Pat. No. 6,221,709.

BACKGROUND

The present invention relates to CMOS integrated circuit device structures and fabrication methods, and more particularly to transistor doping profiles in self-aligned gate processes.

FIG. 1 shows a portion of a prior-art CMOS integrated circuit device formed on a substrate 10 and including representative p-channel and n-channel transistors 1, 3. The p-channel transistor 1 has a gate electrode 2 and the n-channel transistor 3 has a gate electrode 4, both electrodes formed over a gate oxide 24 and both separated by isolation dielectric 16. The gate oxide 24 and the isolation dielectric 16 overlie n-type 12 and p-type 14 silicon regions of the silicon substrate 10. Using conventional fabrication techniques, the n-type silicon region 12 is masked off and an n+ type dopant is implanted in the p-type silicon region 14 not covered by the gate electrode 4 or isolation oxide 16 to form the source and drain regions 6 of the n-channel transistor 3. Then, the n-type silicon region 12 is unmasked and the p-type silicon region 14 is masked. P+ type dopant is then implanted in the n-type silicon region 12 not covered by the gate electrode 2 or isolation oxide 16 to form the source and drain regions 5 of the p-channel transistors 1. The mask is then removed and the device formation is completed typically by depositing a dielectric over the transistors and forming connections to the source, drain, and gate of each of the transistors using conventional metallization layers.

As device size, and particularly channel length, is reduced, conventional drain structure MOS devices can become unreliable due to short channel effects, such as hot carrier effects. Conventional drain structure n-channel MOS devices 3 can become unreliable at longer channel lengths due to short channel effects than conventional drain structure p-channel MOS devices 1.

One way to overcome this problem is to modify the conventional drain structure such that the peak electric field at the drain edge is reduced. This can be done by reducing the drain doping density at the drain edge to produce a lightly doped drain (LDD) structure in the device. The LDD structure in the device may be formed by employing a sidewall spacer of silicon dioxide on the gate material.

FIG. 2 shows complementary n-channel 19 and p-channel 17 MOSFETs with LDDs 8, 11, which are typical of a plurality of such MOSFETs in a CMOS IC device. In a conventional process for forming LDD MOSFETs using CMOS technology, n-type 12 and p-type 14 wells are defined in a silicon substrate 10 and are isolated by isolation oxide 16. The gate oxide 24 is then formed and polysilicon gate electrodes 20, 22 are patterned on the gate oxide 24. The p-type silicon region 14 is then masked off and p-type dopant is then implanted into the n-type silicon region 12 to form the LDD regions 8 of the p-channel source and drain regions 7. The p-type silicon region 14 is unmasked and the n-type silicon region 12 is then masked off. N-type dopant is implanted into the p-type silicon region 14 to form the LDD regions 11 of the n-channel source and drain regions 9. The mask is then removed. A layer of silicon dioxide 2000–5000 Å thick is deposited over the device and then the silicon dioxide is anisotropically etched back to form oxide sidewall spacers 13, 15 on the gate electrodes 20, 22. The p-type silicon region 14 is again masked off and p+ dopant is implanted into the n-type silicon region 12 to form the p-channel source and drain regions 9. The mask is then removed. The n-type silicon region 14 is masked off and n+ dopant is implanted to form the n-channel source and drain regions 9. The device processing is completed using conventional techniques to form conductive interconnect and insulating layers.

A problem in employing the known sidewall spacer technology in the manufacture of an LDD device is that the p-channel devices must be masked during the LDD processing of the n-channel devices, and the n-channel devices must be masked during the LDD processing of the p-channel devices, since the LDD implant penetrates all unmasked areas of the CMOS device being fabricated. Accordingly, an extra masking layer is required to protect areas of the n-channel devices during the manufacture of the p-channel devices and another extra masking layer is required to protect areas of the p-channel devices during the manufacture of the n-channel devices.

FIGS. 3 shows two of a plurality of complementary n-channel 23, and p-channel 21, MOSFETS with LDDs 8, 11 manufactured according to a conventional method of manufacturing LDD devices using removable sidewall spacers. The n-type and p-type wells 12, 14 are defined in the silicon substrate 10 and are isolated by isolation oxide 16. Gate oxide 24 is then formed and polysilicon gate electrodes 20, 22 are patterned on the gate oxide 24. A layer of oxide or nitride is deposited over the device and is then anisotropically etched back to form sidewall spacers adjacent to the gate electrodes 20, 22. The p-type silicon region 14 is masked off and p+ dopant is implanted into the n-type silicon region 12 to form the p-channel source and drain regions 7. The mask is removed and the n-type silicon area 12 is masked off. N+ dopant is implanted to form the n-channel source and drain regions 9. The mask is removed and then the sidewall spacers are removed. The p-type silicon region 14 is then masked off and p-type dopant is implanted into the n-type silicon region to form the LDD regions 8 of the p-channel source and drain regions 7. The p-type silicon region 14 is unmasked and then the n-type silicon region 12 is masked off. N-type dopant is implanted into the p-type silicon region 14 to form the LDD regions 11 of the n-channel source and drain regions 9. The mask is then removed. The device processing is completed using conventional techniques to form conductive interconnect and insulating layers.

One problem with using the removable sidewall spacer technology in the manufacture of an LDD device is that again the p-channel device must be masked during the LDD processing of the n-channel device, and the n-channel device must be masked during the LDD processing of the p-channel device. Another problem is that the sidewall spacers must be removed by an etch process before the LDD implants. Accordingly, in addition to the two extra masking layers required during the manufacture, one in the manufacture of the p-channel devices, and one in the manufacture of the n-channel devices, an extra etch is also required in the manufacture of the device.

Alternatively, the removable sidewall spacer technology can be used with only two masking steps, as described in Campbell et al., "MOSFET and Fabrication Method," U.S. Pat. No. 5,087,582, assigned to Inmos Ltd. Still referring to FIG. 3, after the p+ dopant is implanted into the n-type silicon region 12 to form the p-channel source and drain regions 7, while the p-type silicon region 14 is masked off, the sidewall spacers above the n-type silicon region 12 are removed and p-type dopant is then implanted into the n-type silicon region 12 to form the LDD regions 8 of the p-channel source and drain regions 7. The mask is removed and then the n-type silicon area 12 is masked off. N+ dopant is implanted to form the n-channel source and drain regions 9. The sidewall spacers above the p-type silicon region 14 are removed. N-type dopant is implanted in to the p-type silicon region 14 to form the LDD 11 regions of the n-channel source and drain regions 9. The mask is then removed. The device processing is completed using conventional techniques to form conductive interconnect and insulating layers.

A problem with using this alternative removable sidewall spacer technology in the manufacture of an LDD device is that the sidewall spacers must be removed from the p-type silicon region by an etch process before forming the LDD implants in the n-channel transistor, and the sidewall spacers must be removed by a separate etch from the n-type silicon regions before forming the LDD implants in the p-channel transistor. Accordingly, an extra etch is required during the manufacture of the p-channel devices and another extra etch is required during the manufacture of the n-channel devices.

SUMMARY OF THE INVENTION

A method of fabricating an integrated circuit having n-channel and p-channel transistors in a CMOS device is provided in accordance with the present invention. The method includes forming gate electrodes over n-type and p-type silicon regions that define isolated active areas of the device, implanting an n-type dopant into the p-type silicon to form LDD regions of the n-channel transistor. A first insulating layer is then formed over the gate electrodes and the n-type silicon regions are then implanted with a p+ type dopant impurity to form the low to resistivity source and drain regions of the p-channel transistor. A second insulating layer is formed over the first insulating layer. The first and second insulating layers are then etched to provide the sidewall spacers. The p-type silicon regions are then implanted with an n+ type dopant impurity to form the low resistivity regions of the n-channel transistor.

The resulting CMOS integrated circuit has a plurality p-channel transistors formed in active surface areas of n-type regions and a plurality of n-channel transistors formed in isolated active surface areas of p-type regions. Each of the p-channel and n-channel transistors has a gate electrode which overlies and is insulated from the respective active surface. The integrated circuit further contains p-channel source and drain regions each consisting of a low resistivity region, and n-channel source and drain regions, each having a low resistivity region and an LDD region. Each gate electrode having a pair of sidewall spacers having an inner and an outer portion each corresponding to an underlying source and drain region. Each p-channel low resistivity region is located under the outer portion and at least a part of the inner portion of its respective sidewall spacer. Each n-channel low resistivity region is located under at least a part of the outer portion and a part of the inner portion of its respective sidewall spacer. Each n-channel LDD region extends from its respective low resistivity region to underlie the inner portion of its respective sidewall spacer.

The novel features believed characteristic of the invention are set forth in the appended claims. The nature of the invention, however, as well as its features and advantages, may be understood more fully upon consideration of illustrative embodiments when read in conjunction with the accompanying drawings, wherein:

DETAILED DESCRIPTION OF THE PREFERRED EMBODIMENT

Figure 11:
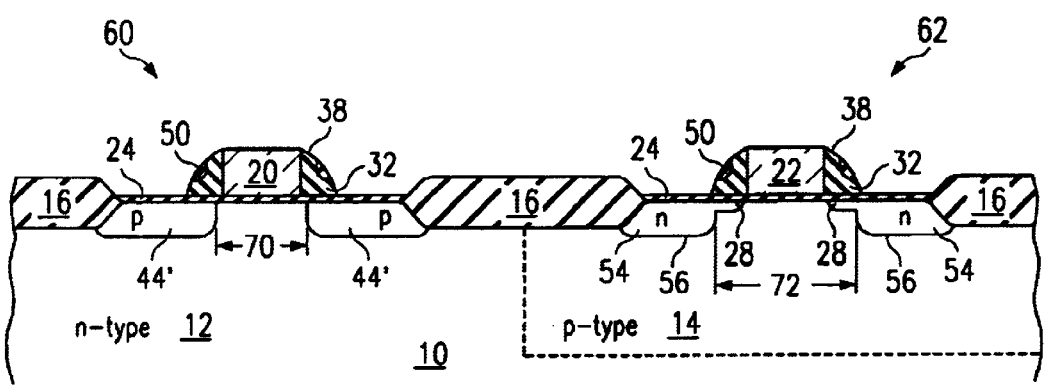
FIG. 11 is a cross-sectional view of two of a plurality of complementary transistors at an advanced stage in the fabrication process prior to the application of conventional conductive interconnect and insulating layers.

LDD regions are used in the manufacture of MOS devices because as device size, and particularly channel length, is reduced, conventional drain structure MOS devices can become unreliable due to short channel effect, such as hot carrier effects. Conventional drain structure p-channel MOS devices remain reliable at shorter channel lengths than conventional drain structure n-channel MOS devices. Referring to FIG. 11, a MOS device, manufactured using CMOS technology, is reliable when the distance 70 between its source and drain 44', i.e. its channel length, is between a minimum length and a maximum length. The minimum length is a distance between the source and drain of the transistor below which the transistor will not operate reliably due to short channel effects when a conventional voltage is applied to the gate electrode. The maximum length is the distance between the source and drain of the transistor above which the transistor will not turn on efficiently. The transistor will not turn on efficiently when current does not flow between the source and drain of the transistor when a conventional voltage is applied to the gate electrode of the transistor. The minimum and maximum lengths are dependent on the gate length, spacer length, diffusion cycles, and junction depth of the implant. Conventional voltage is typically 5, 3.3, or 2.7 volts in current technology.

When an LDD region is used, the length 72 between low resistivity regions of the source and drain regions 54 has to be between a minimum LDD length and a maximum LDD length. The minimum LDD length is a distance between the low resistivity regions 56 of the source and drain regions 54 of the transistor below which the transistor will not operate reliably due to short channel effects. The maximum LDD length is the distance between the low resistivity regions of the source and drain regions 54 of the transistor above which transistor will not turn on efficiently. The transistor will not turn on efficiently when current does not flow between the source and drain of the transistor when a conventional voltage is applied to the gate electrode 22 of the transistor. In current technology, for an n-channel device manufactured using CMOS technology, the n-channel minimum LDD length and the n-channel maximum LDD length is typically primarily based on the doping concentration of the impurity forming the LDD and the LDD length.

The present invention uses two insulating layers to tailor the lengths between the sources and drains of the respective transistors to produce reliable transistors that allow for area shrinkage manufactured using a simplified process when the device size of the transistor is such that the gate electrode width is below the p-channel minimum length.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
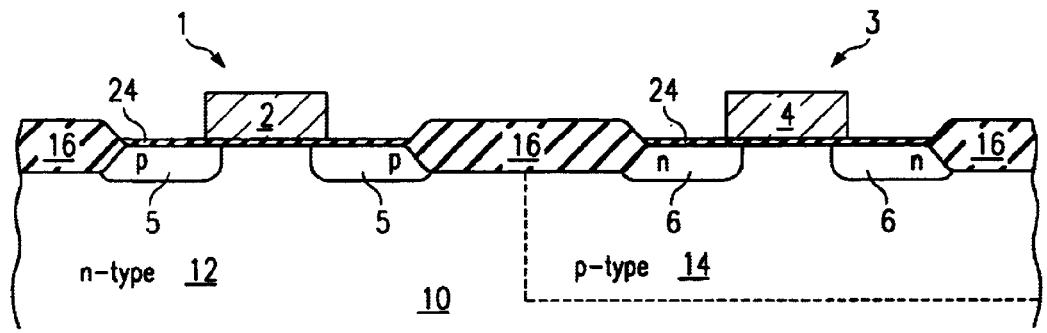
FIG. 1 is a cross-sectional view of a conventional drain CMOS device of the prior art.
Figure 2:
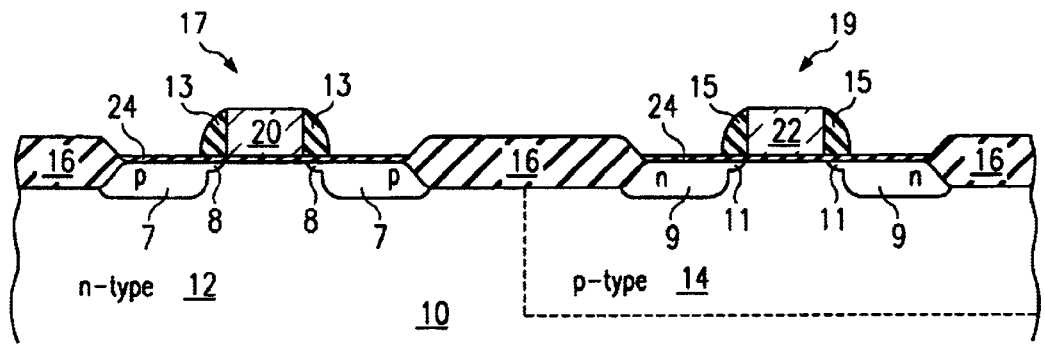
FIG. 2 is a cross-sectional view of a conventional CMOS device in which both the n-channel and p-channel transistors have LDDs and sidewall spacers.
Figure 3:
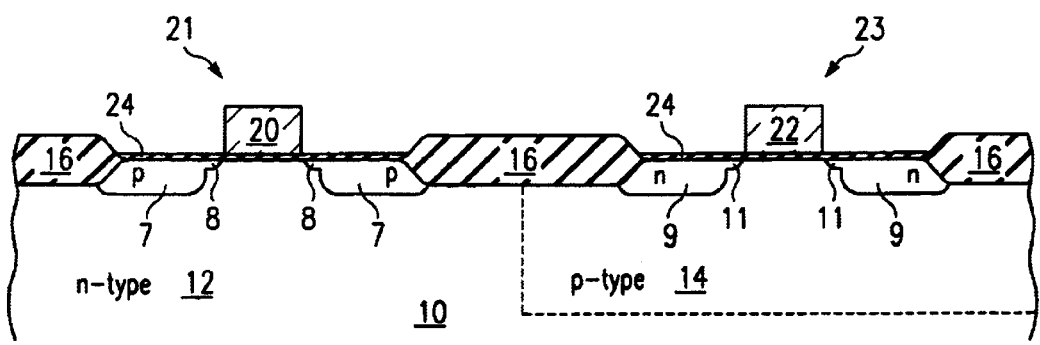
FIG. 3 is a cross-sectional view of a conventional CMOS device in which both the n-channel and p-channel transistors have LDDs but lack sidewall spacers in the final device structure.
Figure 4:
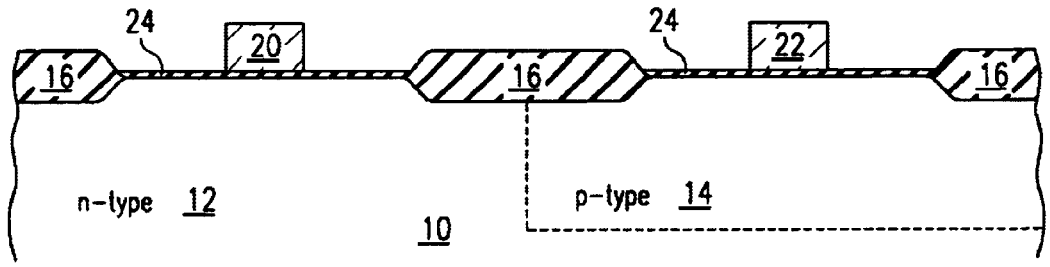
FIGS. 4 through 10 are cross-sectional views illustrating various step of forming two of a plurality of complementary transistors in a CMOS device it according to the present invention.

A method will now be described by which an integrated circuit can be fabricated according to the preferred embodiment of the invention. Referring to FIG. 4, n-type 12 and p-type 14 active regions are formed in a silicon substrate 10. P-channel transistors will be formed in the n-type silicon regions 12, and n-channel transistors will be formed in the p-type silicon regions 14, it being understood that one representative n-type region 12 and one representative p-type region 14 are illustrated in the figures. Regions of isolation oxide 16 are grown on the silicon substrate 10. A thin layer of gate oxide 24 is formed over the n-type 12 and p-type 14 silicon regions. The gate oxide 24 is preferably a conformal undoped, grown, silicon dioxide, having a thickness typically between 60 Å and 250 Å. Polysilicon gate electrodes 20, 22 are formed on the gate oxide layer 24 and then subsequently doped with an n-type dopant. The gate electrode material may be varied provided that it is compatible with the subsequent deposition and etch processes required by the method of the present invention. It will be understood that the gate electrode material may include a silicide or polycide composition. The chemistry and fabrication techniques employed in the method of the present invention are known in the art and constitute conventional CMOS processing. The process steps are independent of the choice of CMOS structure, which may be n-well, twin well, or p-well, although the drawings illustrate a CMOS structure having n- and p-wells. It should be also understood that although the drawings illustrate only one complementary pair of CMOS transistors, an array of such transistors may be fabricated in accordance with the present invention on a single silicon substrate.

Figure 5:
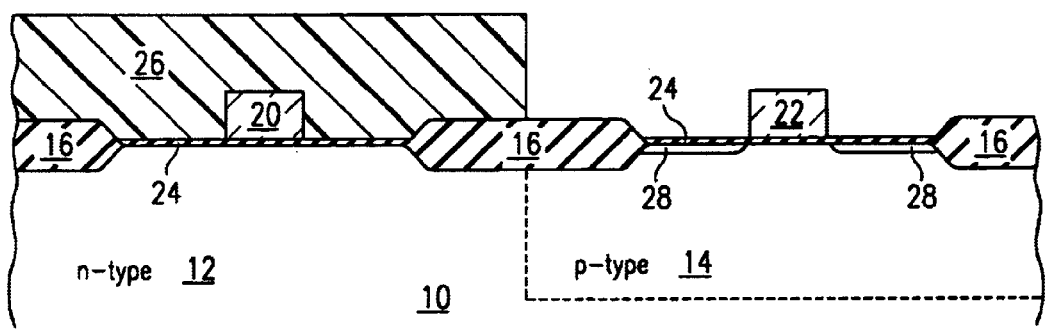

Referring to FIG. 5, a photoresist mask 26 is applied over the n-type silicon region 12. N-type dopant is then implanted in the unmasked areas of the p-type silicon region 14 to form LDD and halo implants 28 in the source and drain regions of the n-channel transistor.

Figure 6:
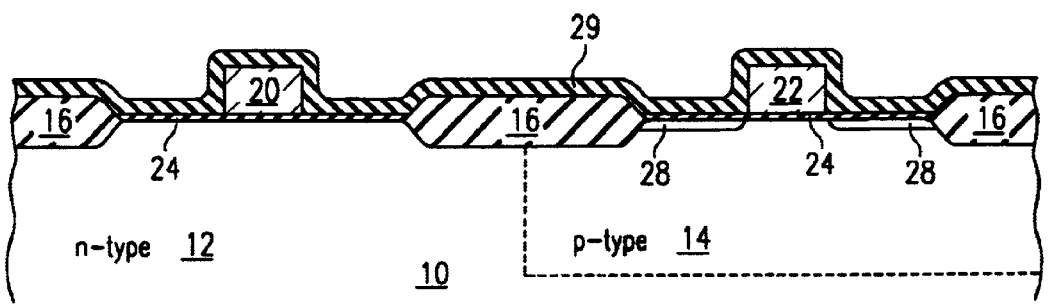

The mask is then removed, and a first insulation layer 29 is deposited over the structure, as shown in FIG. 6. The first insulation layer 29 is preferably a conformal, undoped oxide, although any conformal insulator can be used. The first oxide 29 has to be thick enough such that sum of the thickness of the first oxide 29 on both sides of the gate electrode 20 and the width of the gate electrode 20, minus the distance the p+ type dopant outdiffuses in subsequent process step, is above the p-channel minimum length and below the p-channel maximum length. In conventional technology, the oxide 29 can have a thickness between 500 Å and 2500 Å.

Figure 7:
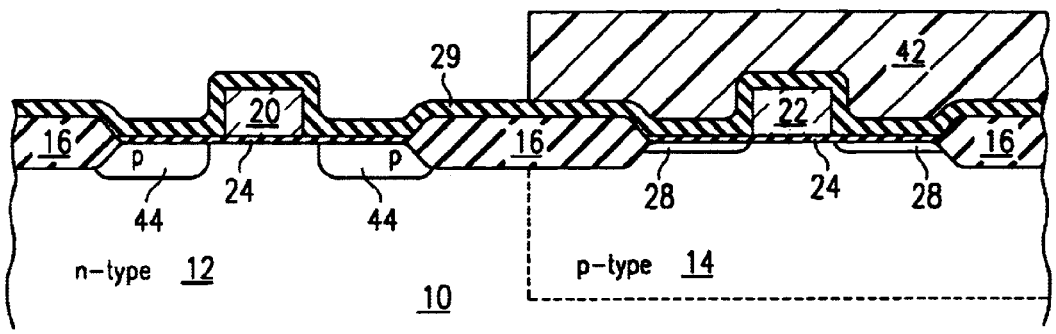

The source and drain regions 44 of the p-channel transistor are now formed by implanting a conventional p+ type dopant Referring to FIG. 7, a photoresist mask 42 is applied over the p-type silicon regions 14. P-type dopant is then implanted through the first oxide 29 in the unmasked areas of the n-type silicon region 12 to form the source and drain regions 44 of the p-channel transistors. The p-type dopant is preferably Boron, although $BF_2$ or any other p-type dopant can be used.

Figure 8:
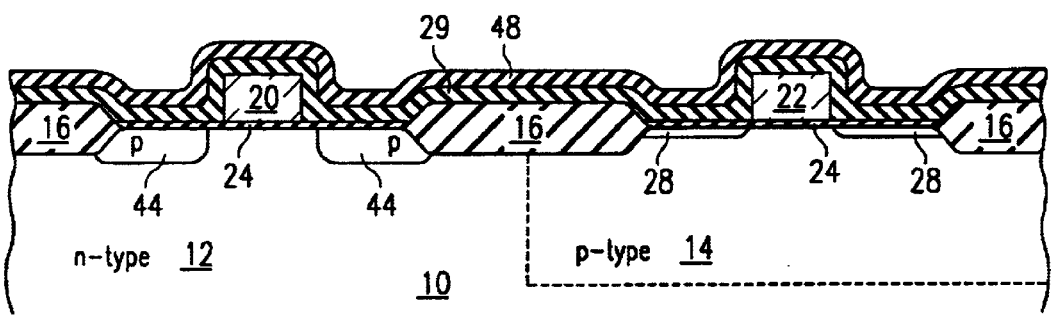

Referring to FIG. 8, the mask 42 has been removed, and a second insulation layer 48 is deposited over the structure. The second insulation layer 48 is preferably a conformal, undoped oxide, although any conformal insulator can be used. The second oxide 48 has to be thick enough such that the sum of the width of the sidewall spacers formed from the first 29 and second 48 oxides and the width of the gate electrode 22 is above the n-channel minimum LDD length and below the n-channel maximum LDD length. In current technology, the second oxide 48 can have a thickness between 500 Å and 2500 Å.

Figure 9:
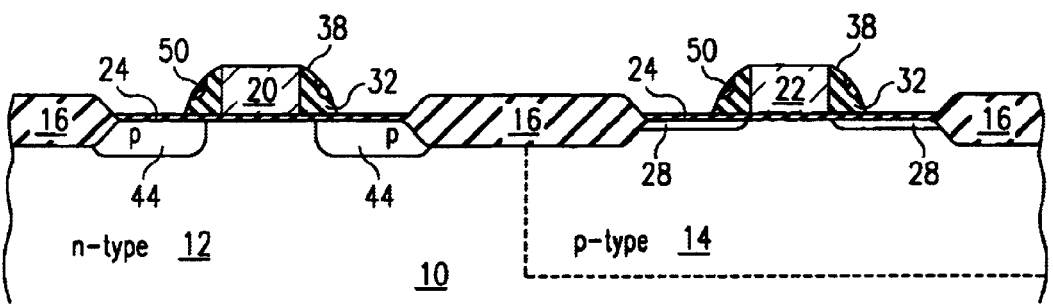

The oxide layer 48 is then anisotropically etched to form sidewall spacers 38, as shown in FIG. 9. Referring to FIGS. 8 and 9 simultaneously, the first oxide 29 forms the inner portion 32 of the sidewall spacer 38. The second oxide 48 forms the outer portion 50 of the sidewall spacer. The width of the bottom edge of the entire sidewall spacer 38 should be such that the width of the bottom edge of two sidewall spacers 38 adjacent to the gate electrode 22 combined with the width of the gate electrode 22 is above the n-channel minimum LDD length and below the n-channel maximum LDD length. In current technology, the width of the bottom edge of the sidewall spacer 38 can be between 1000 Å and 5000 Å.

Figure 10:
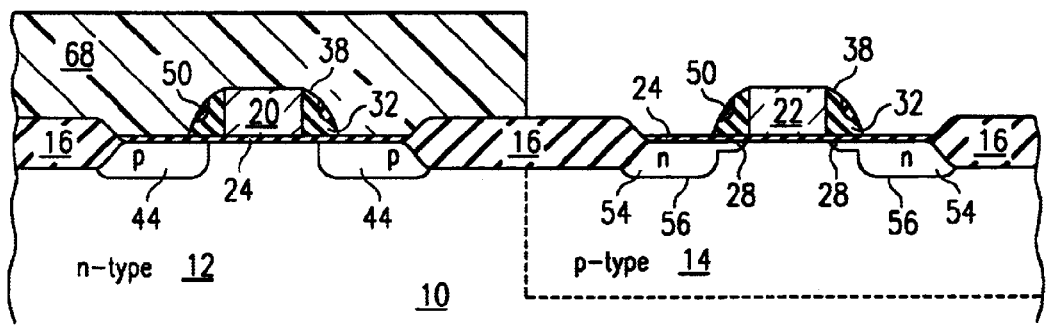

The source and drain regions of the n-channel transistor are now formed by implanting a conventional n+ type dopant Referring to FIG. 10, a photoresist mask 68 is applied over the n-type silicon active area 12. N+ type dopant is implanted in the unmasked areas of the p-type silicon region 14 to form the source and drain regions 54, of the n-channel transistor. The mask 68 is then removed.

FIG. 11 shows the resultant structure after subsequent thermal processes. The p+ type implant diffuses further under the sidewall spacers 38. The structure consists of an n-channel LDD MOSFET 62 and a p-channel MOSFET 60 without an LDD, i.e., a non-LDD MOSFET. Conventional process steps can be used to complete the MOSFETs. A dielectric (not shown), such as undoped or doped oxide and/or SOG, is deposited over the MOSFETs, and connections are made between the gates 20, 22, source and drain regions 44', 54 of the MOSFETs and a metallization layer (not shown).

The self-aligned formation of the source and drain regions 44' of the p-channel MOSFET 60 using only the first oxide layer, and the self-aligned formation of the low resistivity portions 56 of the source and drain regions 54 of the n-channel MOSFET 62 using the entire sidewall spacers 38, allows the formation of complementary transistors 60, 62 having optimized characteristics. This also reduces the number of process steps used, using two masking steps and one etch. This is particularly useful when the width of the gate electrodes 20 is so a short that, if the source and drains were self-aligned to the gate, later thermal processing steps would make the channel length smaller than the p-channel minimum length. The inner portions of the sidewall spacers allow the source and drain regions to be implanted farther apart and spaced from the gate electrode. This prevents the p-channel transistor from suffering from short channel effects. The sidewall spacers 38 allow the low resistivity regions 56 of the n-channel transistor 62 to be formed farther apart than the source and drain regions 44' of the p-channel transistor 60. This prevents the n-channel transistor 62 from suffering from short channel effects.

Still referring to FIG. 11, the physical construction of an integrated circuit formed according to the preferred embodiment of the present invention will now be described in detail. A p-channel transistor 60 is located in a n-type silicon region 12, and an n-channel transistor 62 is located in a p-type silicon region 14. A dielectric 24 preferably of conformal undoped silicon dioxide overlies active n-type 12 and p-type 14 silicon regions of substrate 10. The active surface portions of regions 12 and 14 are separated by an isolation oxide 16. The properties and thickness of dielectric 24 are those needed to form a gate oxide. In modem process technology dielectric 24 is usually silicon dioxide deposited between 60 Å and 250 Å thick. Gate electrodes 20 and 22 overlie the gate oxide 24. Sidewall spacers 38 are adjacent to the gate electrodes 20, 22. The sidewall 38 spacers each have an inner 32 and an outer 50 portion.

Source and drain regions 44' of the p-channel transistor 60 are in the n-type silicon region 12 between the surrounding portions of isolation oxide 16 and the gate electrode 20. Since the p-channel transistor 60 is a conventional drain transistor, its source and drain regions 44' consist of low resistivity regions. The source and drain regions 44' of the p-channel transistor 60 are located under the outer portions 50 of the sidewall spacers 38 and under at least part of the inner portions 32 of the sidewall spacers 38. The channel length 70 of the p-channel transistor 60 is greater than the p-channel minimum length and less Man the p-channel maximum length.

Source and drain regions 54 of the n-channel transistor 62 are in the p-type silicon region 14 between the surrounding portions of isolation oxide 16 and the gate electrode 22. The low resistivity regions 56 of the source and drain regions 54 of the n-channel transistor 62 are located under at least part of the outer portions 50 and a part of the inner portion of the sidewall spacers 38. The LDD regions 28 of the source and drain regions 54 of the n-channel transistor 62 extend from the low resistivity regions 56 laterally inward under the inner portions 32 of the sidewall spacers 38. The distance 72 between the low resistivity regions 56 of the n-channel transistor 60 is greater than the n-channel minimum LDD length and less than the n-channel maximum LDD length.

The width of the gate electrodes 20 can be so short that, if the source and drains 44' were self-aligned to the gate 20, later thermal processing steps would make the channel length 70 smaller than the p-channel minimum length. To accommodate such a short gate electrode width, the first oxide is used to self-align the low resistivity source and drain regions 44'. This prevents the p-channel transistor 60 from suffering from short channel effects. The sidewall spacers 38 are used to self-align the low resistivity regions 56 of the source and drain regions 54 of the n-channel transistor 62 during implantation. This enables spacing of the low resistivity regions 56 of the n-channel transistor 62 farther apart than the source and drain regions 44' of the p-channel transistor 60. This prevents the n-channel transistor 62 from suffering from short channel effects without requiring LDD region for the p-channel transistor 60.

As will be appreciated, the invention advantageously places the source and drain regions 44' of the p-channel transistors 60 as far apart as is optimal for that transistor. Likewise, the low resistivity regions 56 of the n-channel device 62 can be spaced optimally farther apart than the source and drain regions 44' of the p-channel transistor 60. Placing the low resistivity regions 56 of the n-channel transistors 62 closer than such optimal spacing can subject the n-channel transistor 62 to failure due to short channel effects. The phenomenon that n-channel MOS devices are more susceptible to short channel effects than p-channel MOS devices gives rise to the problem solved by the present invention. Using two oxide layers allows the formation of a conventional drain (i.e. non-LDD) p-channel transistor 60 and an LDD n-channel transistor 62, thus optimizing the channel length of the respective transistors and reducing the number of process steps in fabricating the CMOS IC device.

As will be appreciated by those skilled in the art, the process steps described above can be incorporated into various conventional process flows.

Although the invention has been specifically described with reference to several preferred and alternative embodiments, it will be understood by those skilled in the art having reference to the current specification and drawings that various modifications may be made and further alternatives are possible without departing from the spirit and scope of the invention as set forth in the appended claims.

What is claimed is:

1. A CMOS integrated circuit device comprising:
    a plurality of p-channel transistors formed in active surface areas of n-type regions, wherein the p-channel transistors do not have LDD source/drain regions;
    a plurality of n-channel transistors formed in isolated active surface areas of p-type regions;
    gate electrodes for the p-channel and n-channel transistors, the gate electrodes overlying and being insulated from the respective active surface areas, wherein the gate electrodes for the p-channel transistors have a width less than a minimum channel length required for the p-channel transistors;
    p-type source and drain regions for the p-channel transistors, each p-type source and drain region consisting of a low resistivity region;
    n-type source and drain regions for the n-channel transistors, each n-type source and drain region having a low resistivity region and an LDD region;
    each gate electrode having a pair of sidewall spacers each having an inner and an outer portion, wherein the inner portions of the sidewall spacers for each p-channel transistor gate electrode has a width which, taken on each side of the respective gate electrode for the respective p-channel transistor and combined with the width of the respective gate electrode for the respective p-channel transistor, exceeds a minimum channel length for the respective p-channel transistor;
    each p-channel low resistivity region located under the outer portion and at least a part of the inner portion of its respective sidewall spacer;
    each n-channel low resistivity region located under at least a part of the outer portion and a part of the inner portion of its respective sidewall spacer; and
    each n-channel LDD region extending from its respective low resistivity region to underlie the inner portion of its respective sidewall spacer.

2. The integrated circuit of claim 1, wherein the inner portion of the sidewall spacer comprises an oxide.

3. The integrated circuit of claim 1, wherein the inner portion of the sidewall spacer comprises an oxide.

4. The integrated circuit of claim 1, wherein the p-channel source and drain comprise silicon implanted with $BF_2$.

5. The integrated circuit of claim 1, wherein:
the distance between low resistivity regions of the source and drain regions of the p-channel transistor is between the p-channel minimum length and the p-channel maximum length, wherein:
the p-channel minimum length is a distance below which the transistor will not operate reliably due to short channel effects; and
the p-channel maximum length is a distance above which the transistor will not turn on efficiently.

6. The integrated circuit of claim 1, wherein:
the distance between the low resistivity regions of the n-channel transistor is between the n-channel minimum LDD length and the n-channel maximum LDD length, wherein:
the n-channel minimum LDD length is a distance below which the transistor will not operate reliably due to short channel effects; and
the n-channel maximum LDD length is a distance above which the transistor will not turn on efficiently.

7. The integrated circuit of claim 1, wherein the sidewall spacers have a total width of approximately 500 to 2500 Å.

8. A CMOS integrated circuit structure, comprising:
an n-channel transistor including lightly doped source and drain regions within a p-type region of a substrate; and
a p-channel transistor without lightly doped source and drain regions within an n-type region of the substrate, the p-channel transistor including:
a gate electrode having a width less than a channel length of a channel for the p-channel transistor; and
first sidewall spacer regions adjacent opposing sides of the gate electrode and overlying at least a portion of the channel for the p-channel transistor and portions of source and drain regions for the p-channel transistor,
wherein the width of the gate electrode is less than a minimum channel length required for the p-channel transistor,
wherein the first sidewall spacer regions have a width which, taken on opposing sides of the gate electrode and combined with the width of the gate electrode, exceeds the minimum channel length required for the p-channel transistor, and
wherein the width of the first sidewall spacer regions, taken on opposing sides of the gate electrode and combined with the width of the gate electrode, exceeds the minimum channel length required for the p-channel transistor plus a diffusion distance for implanted dopants forming source and drain regions for the p-channel transistor.

9. The CMOS integrated circuit structure of claim 8, further comprising:
second sidewall spacer regions adjacent the first sidewall spacer regions and overlying source and drain regions for the p-channel transistor.

10. The CMOS integrated circuit structure of claim 8, wherein the n-channel transistor further comprises:
a gate electrode having a width approximately equal to a minimum channel length required for the n-channel transistor; and
sidewall spacers adjacent to opposing sides of the n-channel transistor gate electrode and overlying the lightly doped source and drain regions.

11. An intermediate structure for use in forming a CMOS integrated circuit, comprising:
a p-type region for an n-channel transistor including lightly doped source and drain regions;
an n-type region for a p-channel transistor without lightly doped source and drain regions;
a gate electrode overlying a portion of the n-type region, the gate electrode having a width less than a minimum channel length required for the p-channel transistor; and
at least one conformal insulating layer over a top and sides of the gate electrode, the insulating layer having a thickness which, taken on opposing sides of the gate electrode and combined with the width of the gate electrode, exceeds a minimum channel length required for the p-channel transistor,
wherein the insulating layer forms a mask for implanting source and drain regions for the p-channel transistor.

12. The intermediate structure of claim 11, wherein the insulating layer has a thickness which, taken on opposing sides of the gate electrode and combined with the width of the gate electrode, exceeds the minimum channel length required for the p-channel transistor plus a diffusion distance for implanted dopants forming the source and drain regions for the p-channel transistor.

13. The intermediate structure of claim 12, further comprising:
source and drain regions for the p-channel transistor within the n-type region, wherein edges of the source and drain regions are spaced apart from the sides of the gate electrode.

14. The intermediate structure of claim 13, wherein the source and drain regions are low resistivity regions.

15. The intermediate structure for use in forming a CMOS integrated circuit, comprising:
a p-type region for an n-channel transistor including lightly doped source and drain regions;
an n-type region for a p-channel transistor without lightly doped source and drain regions;
a gate electrode overlying a portion of the n-type region, the gate electrode having a width less than a minimum channel length required for the p-channel transistor;
at least one conformal insulating layer over a top and sides of the gate electrode, the insulating layer having a thickness which, taken on opposing sides of the gate electrode and combined with the width of the gate electrode, exceeds a minimum channel length required for the p-channel transistor; and
a second insulating layer overlying the first insulating layer to form sidewall spacers adjacent the gate electrode upon etching of the insulating layer and the second insulating layer.

16. The intermediate structure of claim 15, further comprising:
a n-channel transistor gate electrode overlying a portion of the p-type region;
lightly doped source and drain regions within the p-type region aligned with the n-channel transistor gate electrode.

* * * * *